(12) United States Patent
Aksyuk et al.

(10) Patent No.: US 7,471,184 B1
(45) Date of Patent: Dec. 30, 2008

(54) ROBUST MEMS ACTUATOR FOR RELAYS

(75) Inventors: Vladimir Anatolyevich Aksyuk, Westfield, NJ (US); Flavio Pardo, New Providence, NJ (US); Maria Elina Simon, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/866,154

(22) Filed: Oct. 2, 2007

(51) Int. Cl.
*H01H 61/01* (2006.01)
*H01L 23/58* (2006.01)
*H01L 31/04* (2006.01)
*H01L 21/00* (2006.01)

(52) U.S. Cl. .................... 337/1; 257/467; 257/622; 438/54

(58) Field of Classification Search ............. 257/46, 257/622; 438/54; 337/1
See application file for complete search history.

(56) References Cited

U.S. PATENT DOCUMENTS 6,407,478 B1    6/2002  Wood et al.
7,036,312 B2    5/2006  Menard et al.

OTHER PUBLICATIONS

Agrawal, "A Latching MEMS Relay for DC and RF Applications", Electrical Contacts, 2004, Proceedings of the 50th IEEE Holm Conference on Electrical Contacts and the 22nd International Conference on Electrical Contacts, Sep. 22-23, 2005, pp. 222-225.
F. Pardo, U.S. Appl. No. 11/519,142, filed Sep. 11, 2006 for "Micro-Actuator and Locking Switch".
F. Pardo, et al., U.S. Appl. No. 11/747,555, filed May 11, 2007 for "Electroless Plating Production of Nickel Aned Colbalt Structures".

*Primary Examiner*—Evan Pert (57) ABSTRACT

An apparatus comprising a microelectromechanical system (MEMS) device. The MEMS device includes a substrate having an anchoring pad thereon and a structural element. The structural element has a beam that includes a first part and a second part. The first part is attached to both the anchoring pad and to the second part. The second part is movable with respect to the substrate and made of an electrically conductive material. Additionally, at least one of the following conditions hold: the first part is made of a material having: a first yield stress that is greater than a second yield stress of the electrically conductive material of the second part; a fatigue resistance that is greater than a second fatigue resistance of the electrically conductive material of the second part; or, a creep rate that is less than a second creep rate of the electrically conductive material of the second part.

23 Claims, 12 Drawing Sheets

ROBUST MEMS ACTUATOR FOR RELAYS

TECHNICAL FIELD OF THE INVENTION

The present invention relates, in general, to microelectromechanical system devices, as well as methods of using and manufacturing such devices.

BACKGROUND OF THE INVENTION

Silicon (e.g., polysilicon) is one of the most widely-used structural materials for microelectromechanical system (MEMS) devices. The electrical properties of silicon, however, are not ideal in applications where components having a low electrical resistivity and a high coefficient of thermal expansion (CTE) are desired. Metals have been considered as a replacement material for silicon in such applications.

SUMMARY OF THE INVENTION

One embodiment of the present disclosure is an apparatus comprising a microelectromechanical system (MEMS) device. The MEMS device includes a substrate having an anchoring pad thereon and a structural element. The structural element has a beam that includes a first part and a second part. The first part is attached to both the anchoring pad and to the second part. The second part is movable with respect to the substrate and is made of an electrically conductive material. Additionally, at least one of the following conditions hold. The first part is made of a material having a first yield stress that is greater than a second yield stress of the electrically conductive material of the second part. The first part is made of a material having a fatigue resistance that is greater than a second fatigue resistance of the electrically conductive material of the second part. Or, the first part is made of a material having a creep rate that is less than a second creep rate of the electrically conductive material of the second part.

Another embodiment is a method of use. The method comprises actuating a MEMS thermal actuator device including applying a voltage to the above-described structural element of the device.

Still another embodiment is a method of manufacture an apparatus comprising forming a MEMS device having a structural element. A substrate having a material layer is provided, and the material layer is patterned to form the above-described first part of the beam of the structural element. A mask layer is deposited on the substrate and openings are formed in the mask layer. At least one of the openings defines a location of the above-described second part of the beam. An electrically conductive material is deposited in the at least one opening to thereby form the second part. An underlying portion of the substrate is removed to release the second part from the substrate. The first part remains attached to both the substrate and to the second part.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

As part of the present disclosure, it was found that metals used as components in MEMS devices are prone to a number of structural failures. In particular, movable metal components can suffer from plastic deformation, creep deformation and/or fatigue earlier than desired. Yield stress is the stress value at which a material begins to plastically deform. Fatigue is characterized by the number repetitive motions a component can have before it is deformed. Creep relates to a time-dependent plastic deformation activated by stress and/or temperature. Creep is a permanent deformation in a material after a period under a stress that is lower than the yield stress of the material. This stress can occur while the MEMS device is actuated or when latched in a stressed configuration for an extended time. The term creep rate refers to a rate of change in a dimension of a material (e.g., the absolute or percentage change in the length of a long axis of a beam of the device) versus time under the given stress at a given temperature.

Any one or all of these structural failures can reduce the reliability of MEMS devices that require its components to make precise repetitive movements throughout the device's lifetime. Moreover, there is a lack of proven, processable materials that have both a high thermal expansion coefficient and acceptable resistance to these structural failures. To address these deficiencies, the present disclosure provides MEMS devices having a structural element that includes at least one beam with two parts that are composed of different materials. The first part is made of a material having at least one of a yield stress or fatigue resistance that is greater, or a creep rate that is less, than a yield stress, fatigue resistance or creep rate, respectively, of the different material of the beam's second part. That is, at least one of the following three conditions hold. One, the first part is made of a material having a first yield stress that is greater than a second yield stress of the different material of the second part. Or two, the first part is made of a material having a fatigue resistance that is greater than a second fatigue resistance of different material of the second part. Or three, the first part is made of a material having a creep rate that is less than a second creep rate of the different material of the second part. The first part is located where most of the flexing or other deformation in the device occurs in the structural element, whereas the second part is not subjected to as a high a stress, either during actuation or in latched states of the structural element. Due to such a hybrid design, the structural element can better tolerate deformation and high stresses for extended periods (e.g., weeks, months), even at elevated temperatures. For example, the new structural elements can tolerate such deformations and stresses with little to no permanent deformation or fatigue.

The beam can be a hot beam or a cold beam of the structural element, or, the structural element can have two beams, each with two components: a hot and a cold beam. The term, hot beam refers, to a component of the structural element that is configured to move by bending. The extent of bending depends upon the particular geometry of the MEM device. When an electrical current is passed through the hot beam, the temperature of the hot beam increases by Joule heating. The hot beam's expansion or contraction will cause the hot beam to bend relative to a cold beam that the hot beam is connected to. The term, cold beam, refers to a different additional component of the structural element that is not subject to an electrical current to cause the cold beam to thermally expand or contract. An electrical current in the form of a signal can be passed through the cold beam, however. Bending the hot beam causes the structural element to move in a desired direction to actuate the MEMS device.

Figure 1:
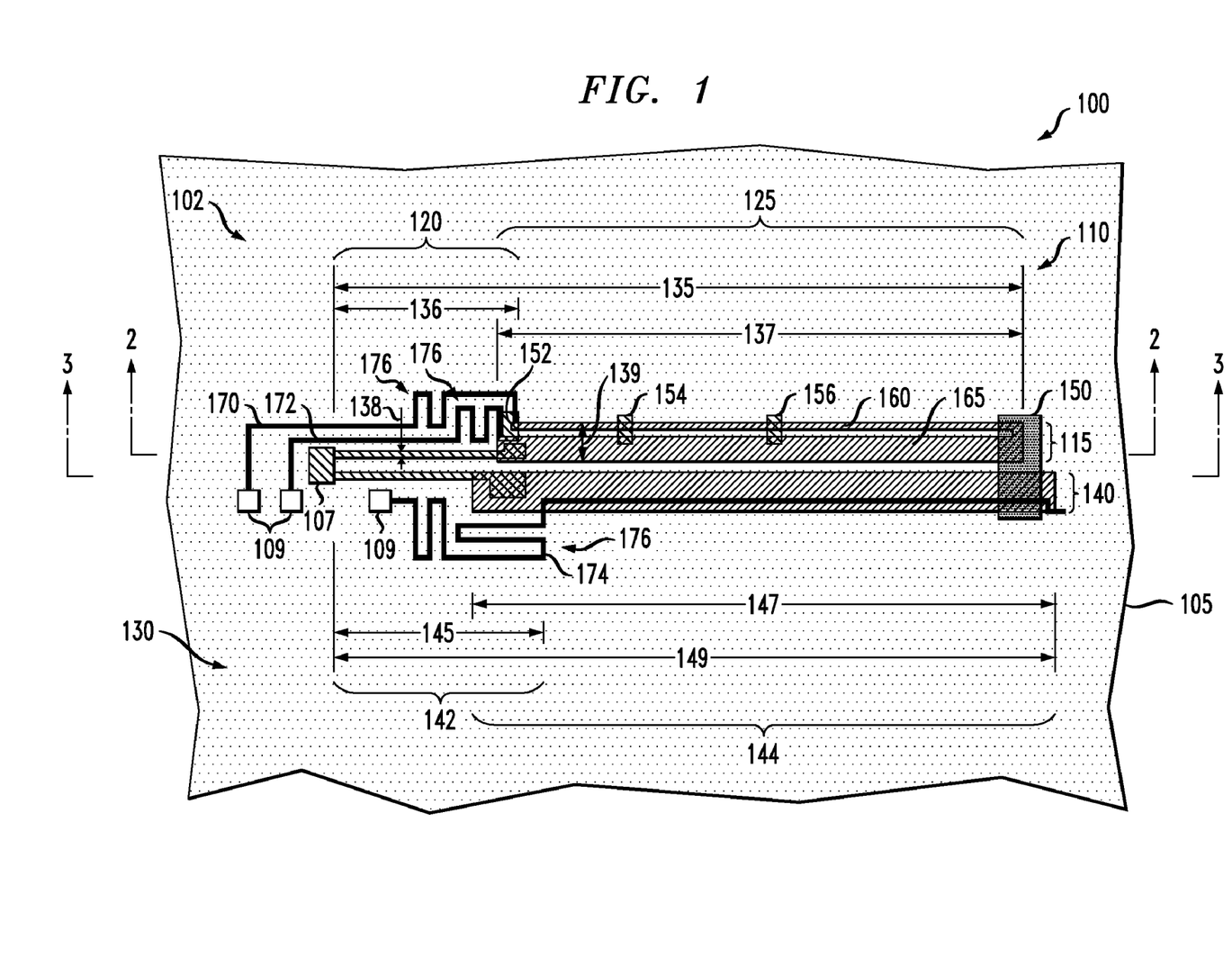
FIG. 1 presents a plan view of an example embodiment of an apparatus of the disclosure.
Figure 2:
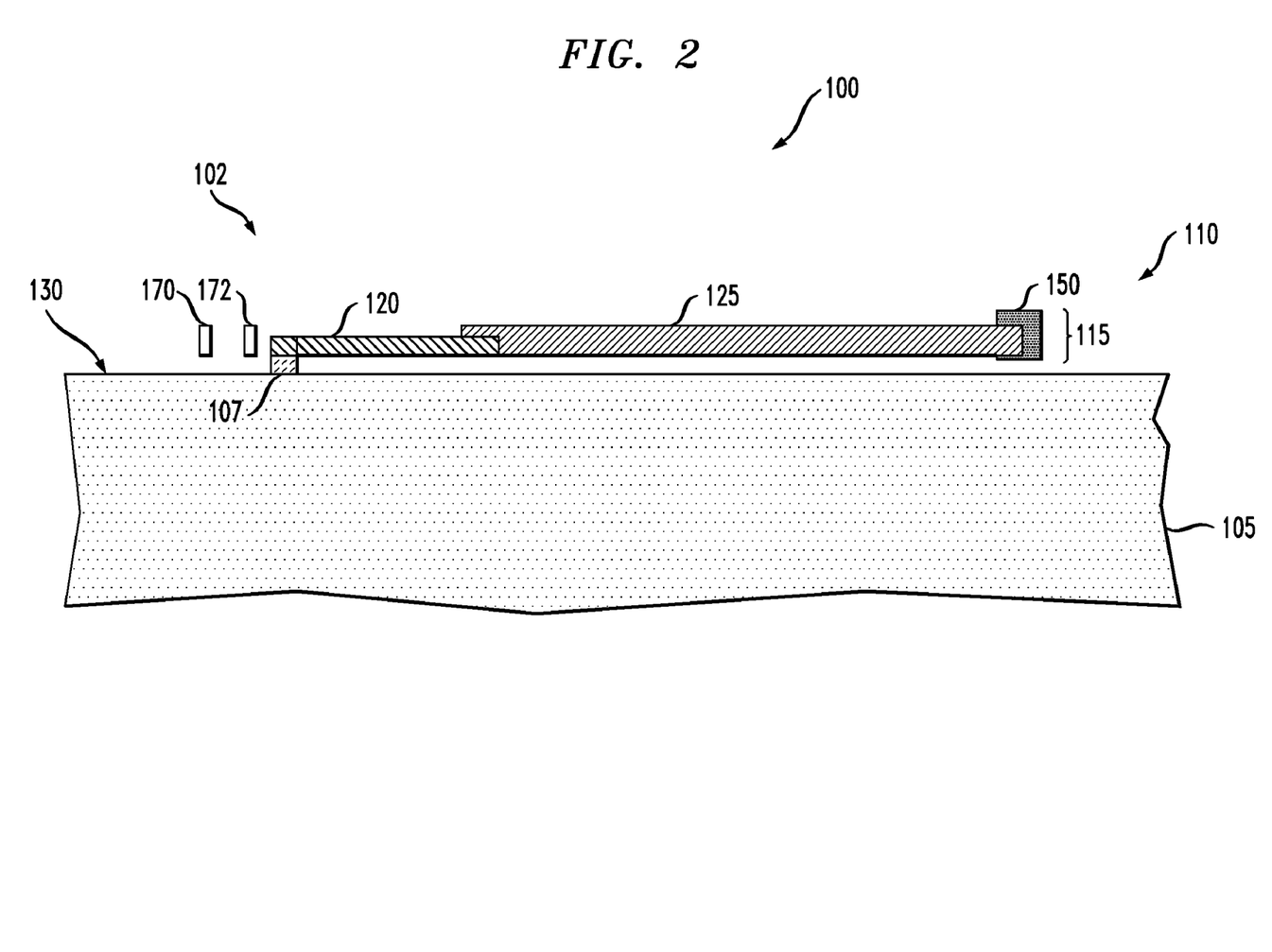
FIG. 2 presents a cross-sectional view of the apparatus shown in FIG. 1.
Figure 3:
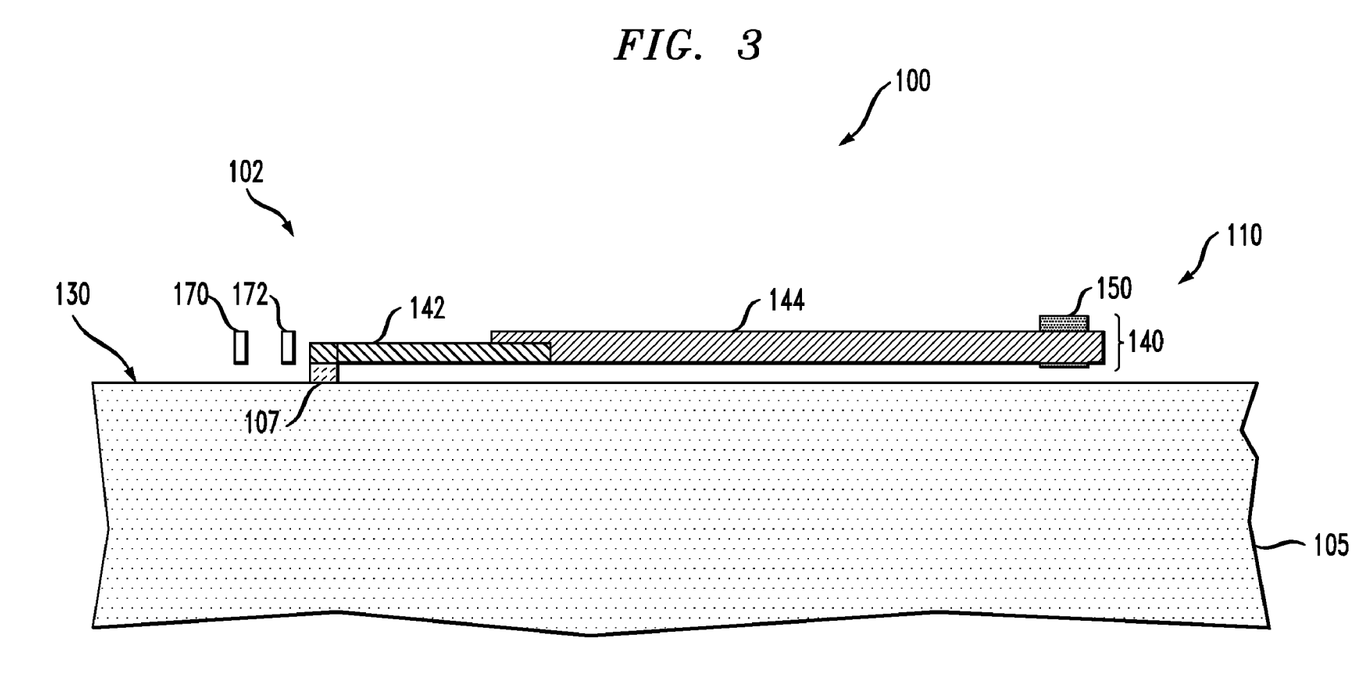
FIG. 3 presents another cross-sectional view of the apparatus shown in FIG. 1.

FIG. 1 presents a plan view of an example embodiment of an apparatus 100 of the invention. FIGS. 2 and 3 present cross-sectional views of the apparatus 100 along view lines 2-2 and 3-3 of FIG. 1, respectively. The apparatus 100 comprises a MEMS device 102 and a substrate 105 having an anchoring pad 107 thereon. The MEMS device 102 also includes a structural element 110 having a beam 115. The beam 115 includes a first part 120 and a second part 125. Although several features of the beam 115 are discussed below when the beam 115 is assumed to be a hot beam, these features would equally apply when the beam 115 is a cold beam.

The first part 120 is attached to both the anchoring pad 107 and to the second part 125, whereas the second part's 125 location is movable relative to the substrate 105, the first part's 120 location remains fixed relative to the substrate 105. For instance as shown in FIGS. 1-3, except through its connection to the anchoring pad 107 and electrical connections 109, the structural element 110 does not contact the planar surface 130 of the substrate 105. It is desirable for the material of the first part 120 to be used in anchoring the beam 115 because flexional forces imposed on the hot beam 115, while the MEMS device 102 is actuated or latched, can be greatest near where the beam 115 is anchored to the substrate 105.

The first and second parts 120, 125 comprise different materials such that one or all of the first part's 120 structural properties (yield stress, fatigue resistance or creep rate) is more favorable than the second part's 125 analogous structural property. That is, the first part 120 is made of a material whose yield stress or fatigue resistance is greater, or whose creep rate is less, than the analogous property of the material of the second part 125. For instance, the material that the first part 120 is made of can have a lower creep rate than the creep rate of the electrical material that the second part 125 is made of. Or, the material that the first part 120 is made of can have a greater yield stress than the yield stress of the material that the second part 125 is made of. Or, the material that the first part 120 is made of can have a greater fatigue resistance than the fatigue resistance of the material that the second part 125 is made of.

The second part 125 is made of an electrically conductive material. E.g., when the beam 115 is a hot beam, the second part 125 of the hot beam 115 can be configured to carry an electrical current that is sufficient to heat the hot beam 115, thereby causing it to thermally expand and thereby move the structural element 110. E.g., when the beam 115 is a cold beam, the second part 125 of the cold beam 115 can also be configured to carry an electrical signal current.

Example materials for the first part 120 include silicon (e.g., polysilicon), silicon germanium, silicon nitride, silicon oxide, or metals, metal alloys. Example materials for the second part 125 include metals, metal alloys, or other electrically conductive materials with a coefficient of thermal expansion that is similar to metals.

The beam 115 can have a first part 120 that includes, or consists essentially of silicon (e.g., at least about 99 wt % Si) and the second part 125 can include, or consists essentially of nickel (e.g., consisting essentially of at least about 99 wt % Ni). In other cases, the first part 120 includes a metal or metal alloy having, e.g., a lower creep rate than the metal of the second part 125. For instance, the metal alloy can include amorphous structures of nickel or cobalt alloyed with phosphorus or boron, such as further described in U.S. patent application Ser. No. 11/747,555, entitled, "Electroless Plating of Nickel and Cobalt Structures" which is incorporated by reference in its entirety.

In some cases, the first part 120 and the second part 125 are consecutive sections of a long axis 135 (e.g., length) of the beam 115. To ensure a strong bond between the long axis 136 of the first part 120 and long axis 137 of the second part 125, the long axes 136, 137 can be designed to overlap. E.g., in some cases, as shown in FIGS. 1 and 2, up to about 50 percent of the long axis 136 of the first part 120 is overlapped by the long axis 137 of the second part 125. In other cases, however, there is no substantially overlap (e.g., less than about 1 percent) between the long axes 136, 137.

As also shown in FIGS. 1-2, for some embodiments of the apparatus 100, at least one dimension (e.g., the long axis part 136) of the first part 120 is shorter than the analogous dimension (e.g., the long axis 137) of the second part 125. Such a configuration can be advantageous over alternative configurations where the first part 120 and second part 125 have the substantially the same dimensions (e.g., long axis 136 is within about 1 percent of the long axis 137), or where one or more dimension of the first part 120 is longer than the second part 125 (e.g., long axis 136 is longer than long axis 137).

For instance, having a longer second part 125 is conducive to maximizing the extent to which the hot beam 115 expands, because the longer second part 125 can expand or contract a larger distance than in the alternative configurations. However, creep distortions of the hot beam 115 are deterred because the shorter first part 120 can still take up the bulk of the stresses imposed on the hot beam 115 when the MEMS device 102 is actuated. In still other embodiments, the width 138 of the first part 120 is narrower than the width 139 the second part 125. Such an arrangement advantageously decreases stress in the second part 125, while allowing for sufficient range of motion and flexibility via a high flexibility of the first part 120.

The structural element 110 shown in FIG. 1 also includes a cold beam 140. FIG. 3 shows a cross-sectional view of the cold beam 140 along view line 3-3 of FIG. 1. In some cases, as shown in FIG. 1, the cold beam 140 is also attached to the anchoring pad 107. However, the cold beam could be attached to the substrate via a separate anchoring pad.

In some cases, the cold beam 140 consists essentially of (e.g., at least 99 wt %) one material (e.g., essentially all silicon or all metal). In such cases, it can be sufficient for only the hot beam 115 to have both the first and second parts 120, 125 because the hot beam 115 is subject to much higher stresses and fatigue than the cold beam 140. In other instances, however, the hot beam 115 is composed entirely of one material and it is the cold beam 140 that has both the first and second parts.

In still other cases, the hot beam 115 and the cold beam 140 of the structural element 110 both have first and second parts. For instance, as illustrated in FIGS. 1-3, the cold beam 140 can have a first part 142 and a second part 144 that are analogous to the first and second parts 120, 125 of the hot beam 115 (FIGS. 1-2). There are advantages in providing a structural element 110 having a hot beam 115 and a cold beam 140 that each have the first part 120, 142 and the second part 125, 144. For instance, the structural element can have smaller ambient temperature-induced changes in shape than a structural element in which only one of the beams has the first and second parts. Additionally, the structural element can be less sensitive to shape changes due to mismatches in residual stresses from the element's manufacture process.

In some embodiments, the first part 142 of the cold beam 140 is made of the same material as the first part 120 of the hot beam 115. Similarly, the second part 144 of the cold beam 140 can be made of the same material as the second part 125 of the hot beam 115. In other cases, however, the first part 142 of the cold beam 140 (second part 144 of the cold beam 140) is made of a different material than the first part 120 of the hot beam 115 (second part 125 of the hot beam 115). These different materials, however, preferably have substantially the same (e.g., within about 10 percent) thermal expansion coefficients as the materials used in the hot beam. Making the two first parts 120, 142 out of the same material and making the two second parts 125, 144 out of the same material (i.e., or materials with substantially the same thermal expansion coefficients) helps to reduce sensitivity to mismatches in residual stresses and helps to avoid undesired movement of the structural element 110 in response to changes in the ambient temperature surrounding the MEMS device 102.

In some cases, it is desirable for the first part 120 of the hot beam 115 to have one or more dimensions (e.g., long axis 136) that are substantially equal to the corresponding one or more dimensions (e.g., length of long axis 145) of the first part 142 of the cold beam 140. The term substantially equal means that the dimension of interest (e.g., the length, height or width of the hot beam) of the hot beam's first part is within about 10 percent of the same dimension of the cold beam's first part. E.g., when the length of the long axis 145 of the first part 142 of the cold beam 140 equals 10 microns, then the length of the long axis 136 of the first part 120 of the hot beam 115 preferably equals about 10±1 microns.

Having substantially equal dimensions for the respective first parts 120, 142 of the hot and cold beams 115, 140, helps to ensure that these parts, when made of the same material, or materials with similar thermal expansion coefficient, will expand or contract by about the same extent when the ambient temperature around the apparatus 100 changes. For instance, consider when the first parts 120, 142 of the hot and cold beams 115, 140 are both made of silicon. If the ambient temperature is raised by 100° C. then first parts 120, 142 made of the same materials (or at least having the same thermal expansion coefficient) will expand by the substantially the same amount (e.g., within about 10 percent). As a result, these portions of the structural element 110 retain the same relative dimensions. Consequently, there is less undesired movement of the structural element 110 than when the first parts 120, 142 of the hot and cold beams 115, 140 are made of different materials having different thermal expansion coefficients.

It is also desirable to form embodiments of the apparatus 100 where the second part 125 of the hot beam 115 a long axis 137 that is substantially equal in length to the long axis 147 of the second part 144 of the cold beam 140. Consider embodiments where the first parts 120, 142 of the hot and cold beams 115, 140 are substantially the same length as each other, and second parts 125, 144 of the hot and cold beams 115, 140 are also the substantially same length of each other (e.g., within about 10 percent). In such embodiments, the long axis 135 of the hot beam 115 is substantially equal (e.g., within about 10 percent) to the length of a long axis 149 of the cold beam 140.

As illustrated in FIGS. 1-3, the apparatus 100 can further include bridging structures 150, 152, 154, 156. Having at least one bridge structure is considered non-optional for some MEM device 102 designs. In the embodiment shown in FIG. 1, the bridge structure 150 that is mechanically connected to ends of both hot and cold beams 115, 140, can be a non-optional component. One or more bridge structures 150 can be fixed to both the hot beam 115 and the cold beam 140. This inter-beam bridge structure 150 can provide the mechanical constraint on the beams 115, 140 needed for the MEM device 102 to operate as designed. For example, the inter-beam bridge structure 150 helps to transfer the thermal expansion of a heated hot beam 115 relative to the cold beam 140 into a transverse motion of the structural element 110. The inter-beam bridge structure 150 can also help to prevent the hot and cold beams 115, 140 from touching each other when the MEMS device 102 is actuated or subjected to a change in ambient temperature.

It is preferable for the inter-beam bridge structure 150 to be electrically non-conductive and have low thermal conductivity. The inter-beam bridge structure 150 can be made of a material that is different than the materials that the first part 120 and second part 125 of the hot beam 115 are made out of (or analogous parts 142, 144 of the cold beam 140). Example suitable materials for the inter-beam bridge structure 150 include polyimide, photosensitive epoxies such as SU8 (MicroChem Corporation, Newton, Mass.), or benzocyclobutene. Other examples include silicon nitride or silicon oxide.

In some cases, making the inter-beam bridge structure 150 out of an electrically conductive material (e.g., a metal) can undesirably heat the cold beam 140 by transferring an electrical current from the hot beam 115 to the cold beam 140. Heating the cold beam 140 is undesirable because this can cause the cold beam's shape to change in a manner that the structural element 110 is not designed to accommodate, thereby causing the MEMS device 102 to malfunction or at least work less efficiently. The electrical current from the hot beam 115 could also interfere with the passage of an electrical signal being passed through the cold beam 140. Making the inter-beam bridge structure 150 out of a thermally conductive material (e.g., silicon) can undesirably transfer heat from the hot beam 115 to the cold beam 140, or draw heat away from the hot beam 115.

One or more of the bridging structures 150, 152, 154, 156 can be fixed to two or more parallel arms 160, 165 of the hot beam 115. The attachment of intra-beam structures 152, 154, 156 can help to prevent the arms 160, 165 of the hot beam 115 from touching each other or other touching components of the MEMS device 102. Similar configuration of bridge structures could be used when the cold beam 140 has multiple arms. Contact between the arms 160, 165 or other components is not desired, because this can deter or at least alter the heating of the hot beam 115 or inappropriately heat other components of the MEMS device 102, thereby causing a device malfunction or work less efficiently.

In some embodiments, one or more intra-beam structures 152, 154, 156 are composed of a material that is thermally conductive. Such materials can advantageously promote the rapid and uniform heating of the arms of the hot beam 115. In some embodiments, one or more intra-beam structures 152, 154, 156 are composed of a material that is electrically conductive. Providing electrically conductive bridge structures 152, 154, 156 can alter the electrical path through the hot beam 115 and thereby advantageously change the heating profile of the hot beam 115 in a desired fashion. In other embodiments, however, the intra-beam structures 152, 154, 156 are made of an electrically non-conductive material so that an electrical current passing through the arms 160, 165 is not short circuited these structures 152, 154, 156.

In some embodiment, one or more intra-beam bridge structures 152, 154, 156 are made of the same material (e.g., silicon) as the first part of the hot beam 115. In other cases, the intra-beam structures 152, 154, 156 are made of the same material as the inter-beam structures 150, the parts 120, 125, 142, 144 of the hot and cold beams 115, 140, or a different material.

In cases where the first parts 120, 142 of the hot or cold beams 115, 140 are electrically conductive, an electrical current can be passed directly to the second parts 125, 144 via the first parts 120, 142. E.g., an electrical current that is sufficient to heat the hot beam 115, and cause the second part 125 of the hot beam 115 to thermally expand, can be sent directly through its first part 120. Or, a signal electrical current can be passed to the second part 144 of the cold beam 140, directly through its second part 144. In such embodiments, one or both first parts 120, 142 can be made of a metal (e.g. a nickel phosphide alloy) or made of a semiconducting material that is doped to reduce its resistivity (e.g., silicon doped with a p-type dopant such as boron).

One of ordinary skill in the art would understand that one or more wires 170, 172, 174 could also be required to complete the electrical connection to the beam 115. In some cases, such as shown in FIGS. 1-3 when one or both of the first parts 120, 142 are made of an electrically insulating material or semiconducting material (e.g., silicon oxide, silicon nitride or polysilicon), one or more wires 170, 172, 174 can be directly attached to the second parts 125, 144 of the hot beam 115 or cold beam 140, thereby bypassing the first parts 120, 142. One or more bridge structures 152 can be fixed to arms 160, 165 and wires 170, 172. The wires 170, 172, 174 can be made of metals such as gold, silver or metal alloys, or of the same conductive material that the second parts 125, 144 are made of (e.g., nickel). As shown in FIGS. 1 and 2, in some embodiments, one or more of the wires 170, 172 are a continuous section of the second part 125 of the hot beam 115. E.g., the wires 170, 172 and second part can be both formed form the same process and electrically conductive material as used to form the hot and cold beam's second parts 125, 144.

To avoid imposing strain, the wires 170, 172, 174 can be each flexibly attached to the hot or cold beams 115, 140. E.g., between attachment points of the wires 170, 172, 174 to the beams 115, 140 and to electrical contacts 109, there can be strain-relief portions 176 (e.g., windings of the wire) of the wires 170, 172, 174. The strain-relief portions 176 are configured to move in free space so as to avoid imposing strain on the wires 170, 172, 174 or the beams 115, 140 when an electrical current is passed through the wires 170, 172, 174.

Figure 4:
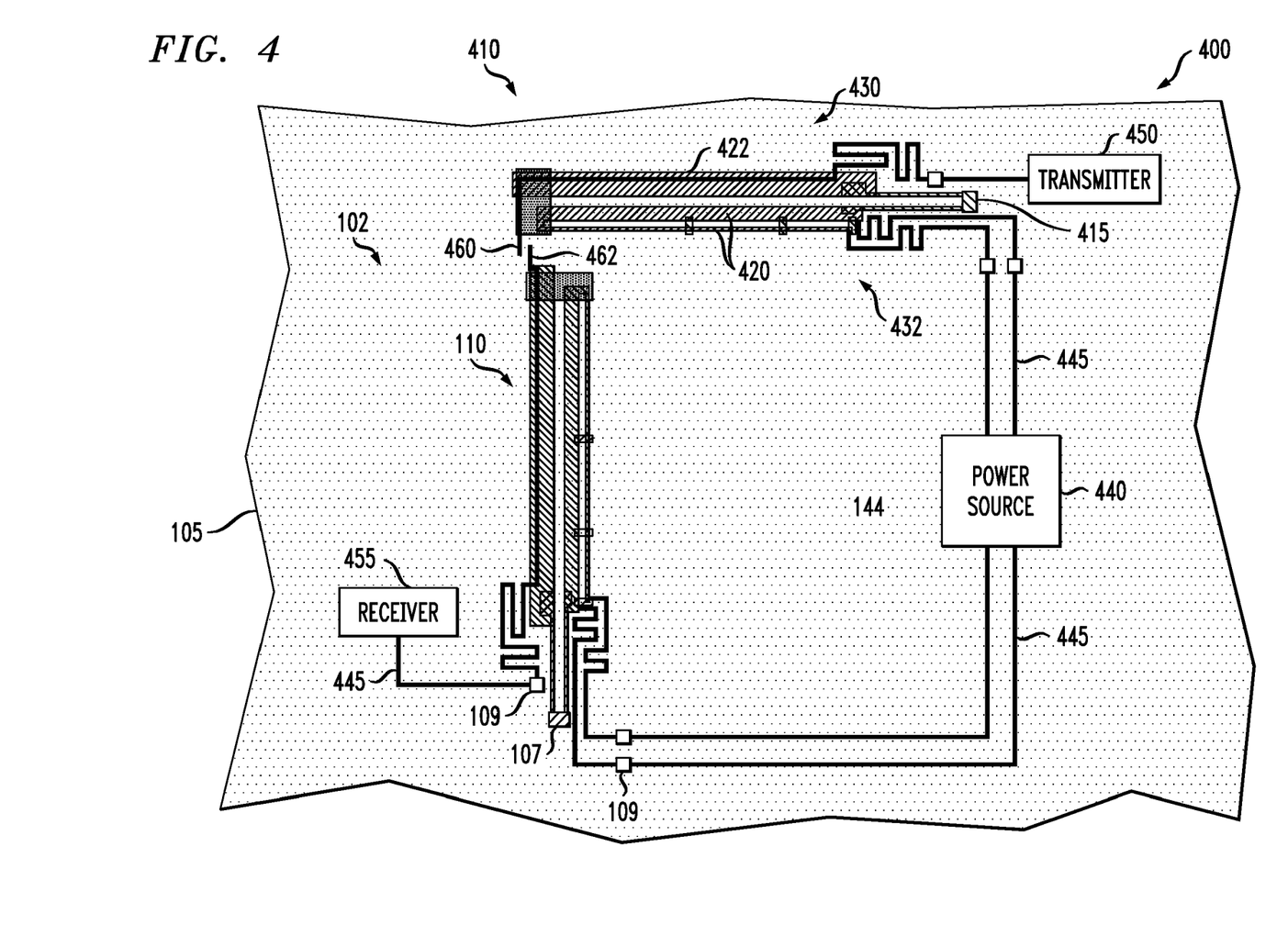
FIG. 4 presents a plan view of a second example embodiment of an apparatus of the disclosure.

FIG. 4 presents a plan view of additional aspects of an example apparatus 400 and MEMS device 102 of the disclosure. Similar reference numbers are used to depict similar features shown in FIGS. 1-3. For the embodiment depicted in FIG. 4, a MEMS device 102, similar to that depicted in FIG. 1, is configured as a microelectromechanical thermal relay. In some cases, the MEMS device 102 is a cross-connect switch in a communication apparatus 400 (e.g., a telecommunication system).

The MEMS device 102 further includes a second structural element 410 on the substrate 105 that is adjacent to, but electrically isolated from, the structural element 110 when the MEMS device 102 is not actuated. The second structural element 410 can be attached to the substrate 102 via an anchoring pad 415 that is similar to the above-described anchoring pad 107. The second structural element 410 can have hot and cold beams 420, 422 that comprise, or in some cases consists essentially of (e.g., at least about 99 wt %), a single material (e.g., nickel). However, the hot and cold beams 420, 422 of the second structural element 410 are preferably composed of the above-described first and second parts 120, 125, 142, 144 (FIG. 1).

As further illustrated in FIG. 4, the hot and cold beams 420, 422 of the second structural element 410 can have long axes 430, 432, respectively, that are perpendicular to the long axes 135, 149 of the structural element 110 (FIG. 1). The apparatus 100 can further include a power source 440 electrically coupled to the structural element 110 (e.g., via electrically conductive contacts 109 and lines 445 on the substrate 105), and in some cases, also electrically coupled to the second structural element 410.

The apparatus 400 can also include a transmitter 450 that is electrically coupled to the structural element 110 (e.g., via metal lines 445 and contacts 109), and a receiver 455 that is electrically coupled to the second structural element 410. The transmitter 450 is configured to transmit a signal through one or both of the structural element 110 and second structural element 410 to the receiver 455. Signal transmission can occur when the MEMS device 102 is actuated to cause one or both of the structural element 110 and second structural element 410 move and thereby contact each other.

With continuing reference to FIG. 1, FIGS. 4 and 5A-5D illustrate another embodiment of the invention, a method of use. As illustrated in FIG. 4, both the structural element 110 and second structural element 410 have projections 460, 462 that are configured to latch the structural element 110 and second structural element 410 together when one or both of these elements 110, 410 are caused to move in a pre-defined fashion.

As noted above, one or both of the structural element 110 or second structural element 410 include or more of the above-described first and second parts 120, 125, 142, 144 (FIG. 1). Consequently, the MEMS device 102 can be actuated a plurality of times, or held in a stressed configuration for prolonged period, without having these structural elements 110, 410 irreversibly deformed by creep deformations. Moreover, the structural element 110 or second structural element 410 having these parts 120, 125, 142, 144 are less prone to move or change shape in response to a change in ambient temperature surrounding the MEMS device 102.

Figure 5A:
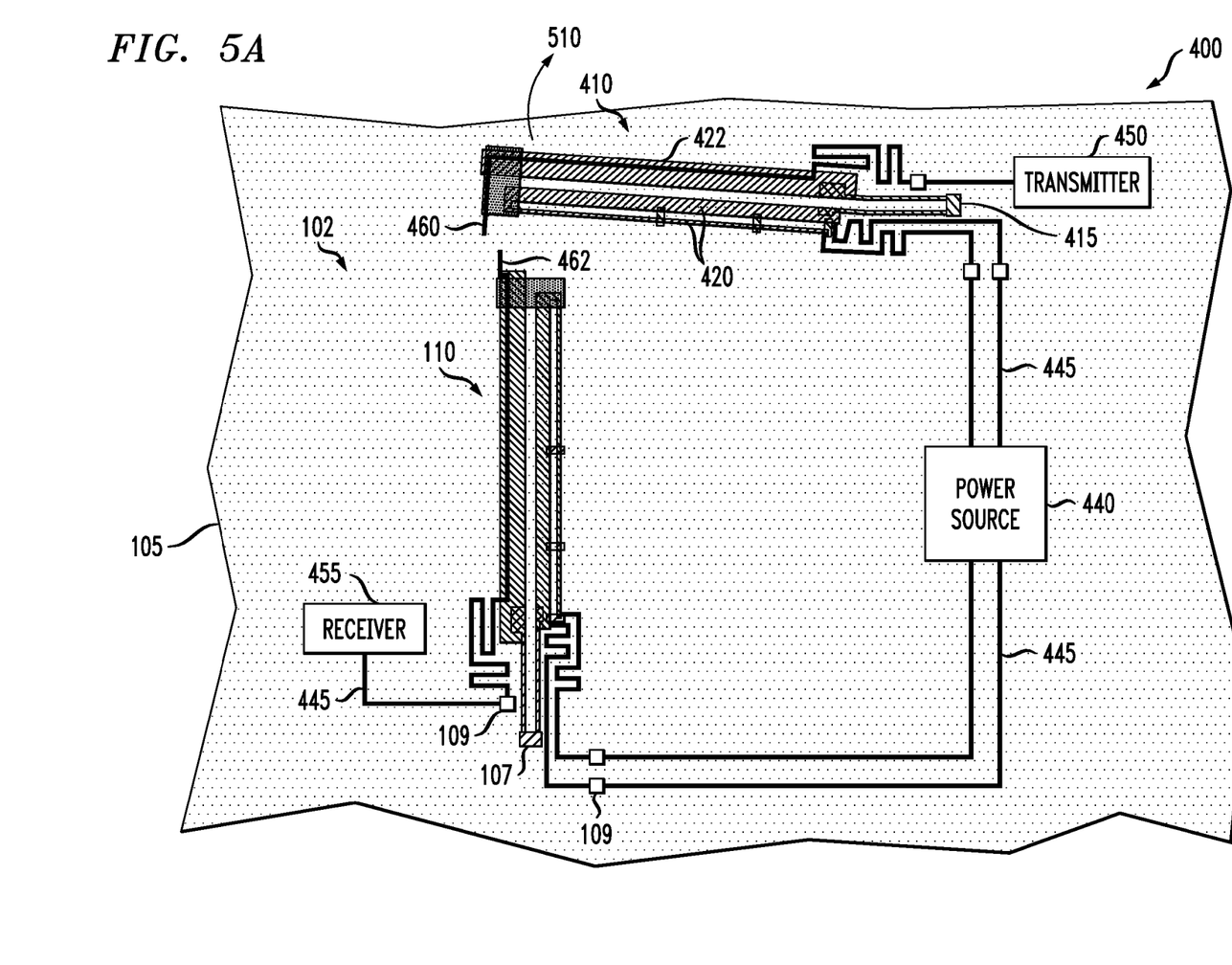
FIG. 5A-5D present schematic views of an example embodiment of an apparatus at a selected stage of use.

FIGS. 5A-5D shows the apparatus 400 depicted in FIG. 4 at different stages of actuating the MEMS device 102. FIG. 4 shows the device 102 with no electrical current applied to either of the structural elements 110, 410. FIG. 5A shows the MEMS device 102 after applying a current (I1) from the power source 440 to the second structural element 410. The applied current is configured to actuate movement of the hot beam 115 (FIG. 1) of the second structural element 410. E.g., a current passing through the structural element 410 can heat the hot beam 115 causing its thermal expansion, while the cold beam 140 does not expand. As illustrated in FIG. 5A, the second structural element 410 can thereby be caused to move laterally in the same plane as the substrate 105, in direction 510.

Figure 5B:
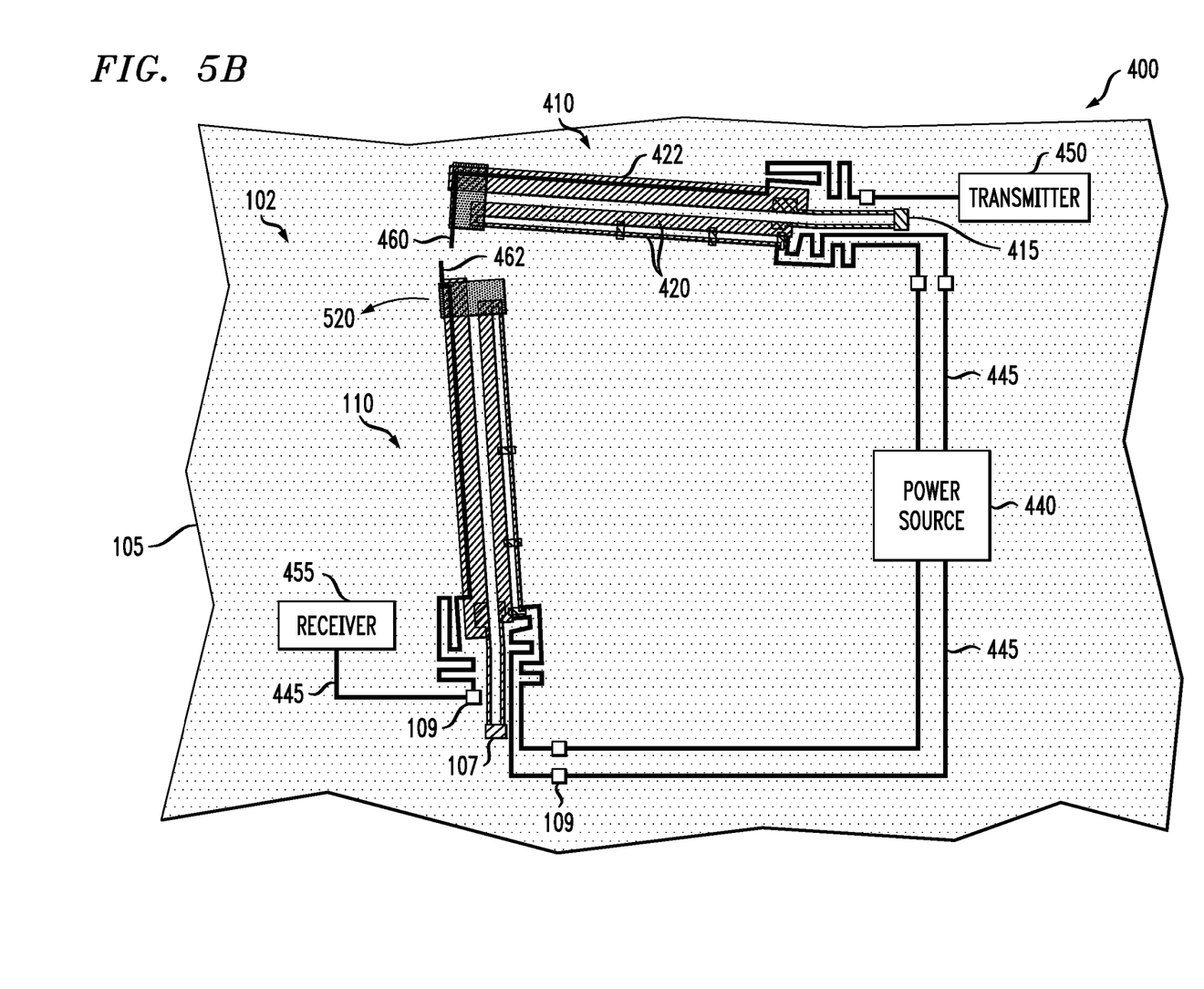

FIG. 5B shows the MEMS device 102 after applying a second current (I2) to actuate movement of the structural element 110 in a fashion similar to that described above for the second structural element 410. E.g., the second structural element 410 is caused to move laterally in direction 520.

Figure 5C:
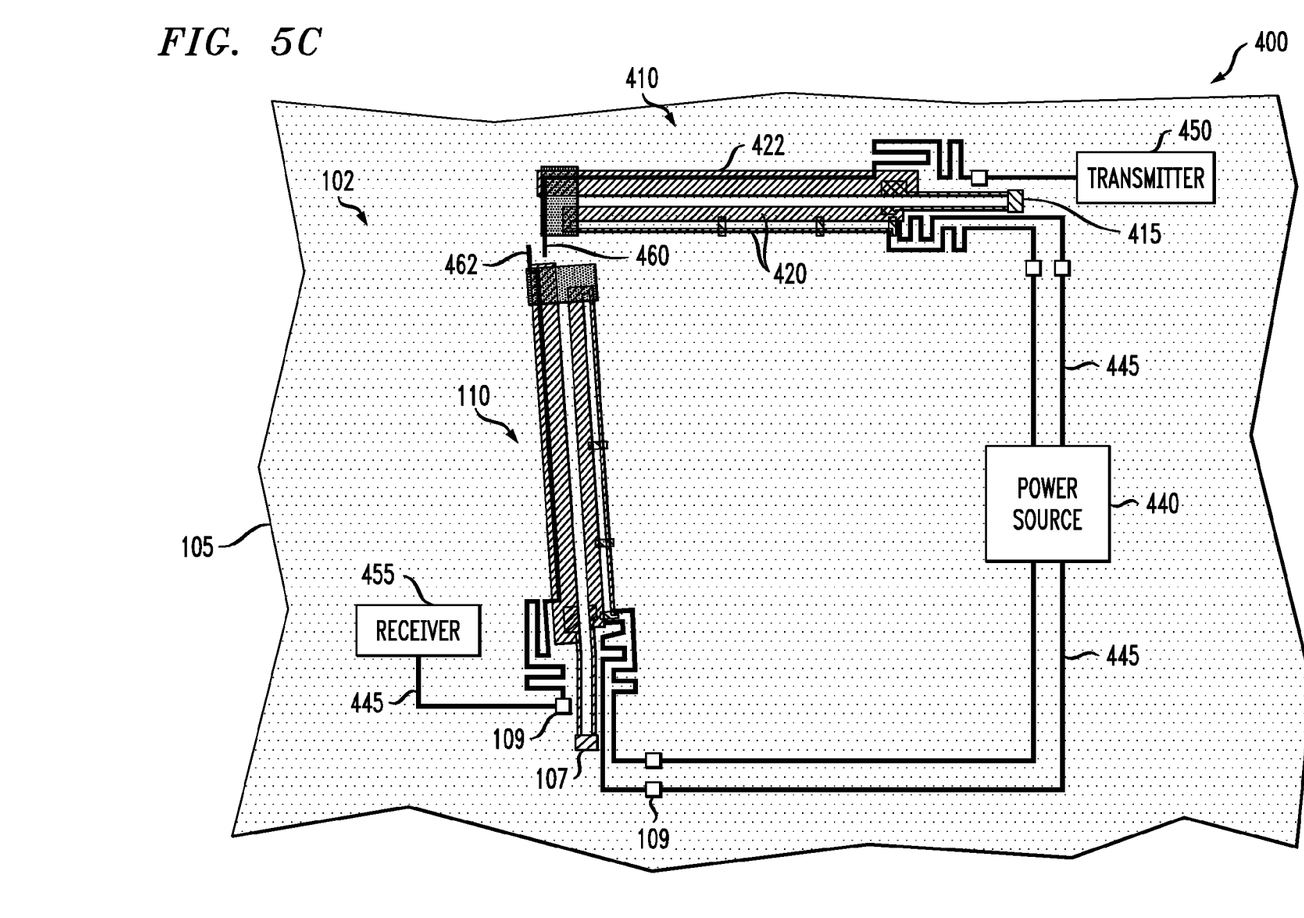
Figure 5D:
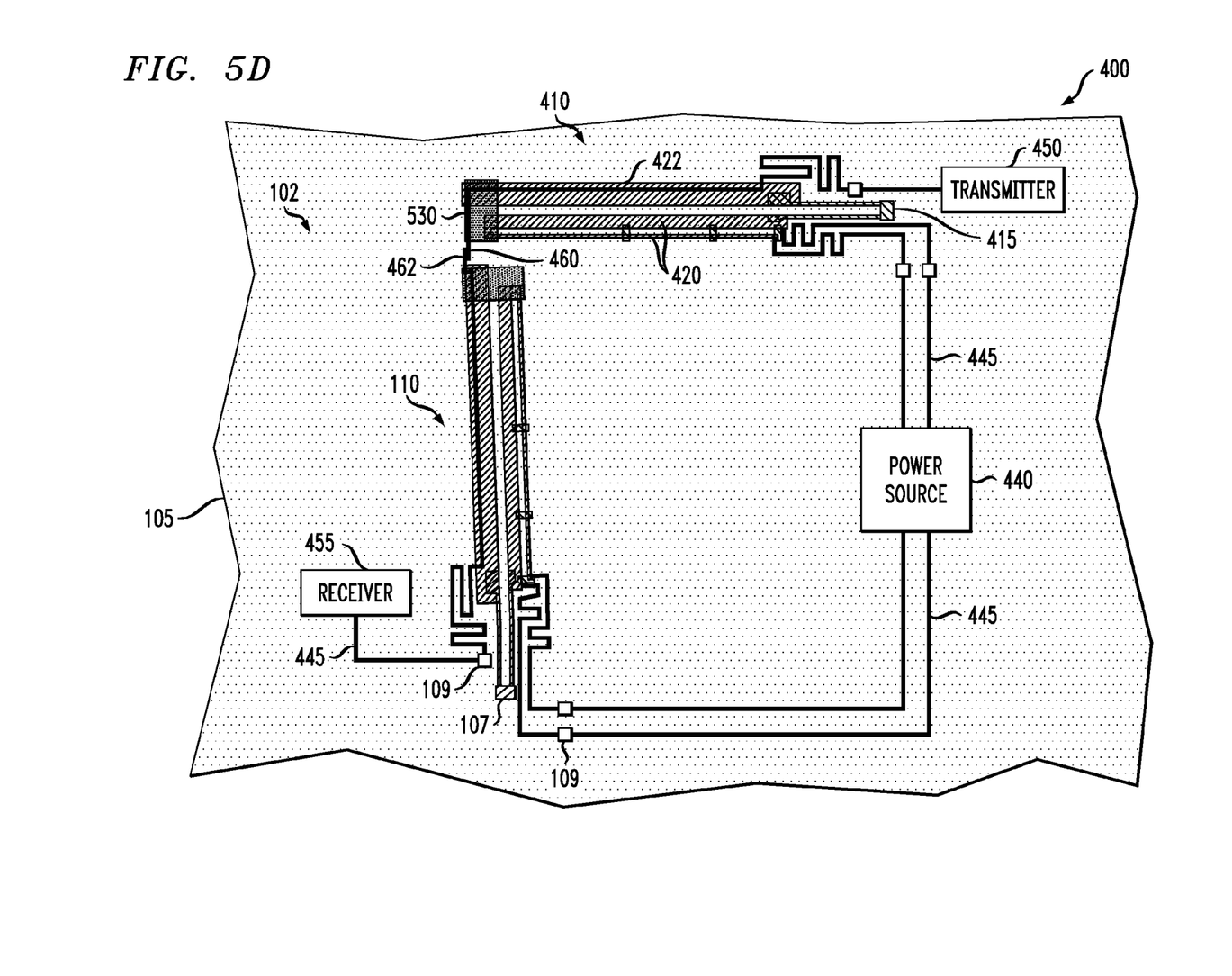

FIG. 5C shows the MEMS device 102 after the applied current I1 is turned off (FIG. 5C) and then current I2 is turned off (FIG. 5D). The currents I1 and I2 are turned off in a sequence (I1 off, then I2 off) that causes the projections 460, 462 of the structural element 110 and second structural element 410 to latch together in a stressed configuration. Latching the two structural elements 110, 410, in turn, thereby creates a conductive path between these two elements 110, 410 that does not require the continuous application of currents I1 and I2. A signal 530 can then be transmitted via the transmitter 450 through one or both of the structural element 110 and second structural element 410 to the receiver 455. For instance, the signal 530 can be transferred through the cold beams 140, 422 of the structural element and second structure elements 110, 410. By turning on and off the applied currents I1, I2 in a pre-defined sequence (e.g., I2 on, I1 on, I1 off, I1 off), the structural element 110 and second structural element 410 can be un-latched from each other, thereby returning the two structural elements 110, 410 to the same state as shown in FIG. 4.

One skilled in the art would understand that the MEMS device 102 and its method of use could have different configurations than that depicted in FIGS. 1-5D. For instance, MEMS devices similar to that depicted in FIGS. 1-5D can be configured as microelectromechanical thermal actuators, relays or switches having structural elements configured to have one, two, or a plurality of beams, as appropriate for these devices. Some example configurations are presented in U.S. Pat. Nos. 6,407,478 and 7,036,312, and U.S. patent application Ser. Nos. 11/519,142 (142') and 11/747,555 (555'), which are all incorporated by reference in their entirety. Regardless of the mechanical configuration of the apparatus and the method of use, however, the MEMS device has at least one a structural element that includes the above described first and second part.

Another embodiment of the invention is a method of manufacturing an apparatus. FIGS. 6-10 present cross-sectional and plan views of an example embodiment of an apparatus 600 at selected stages of manufacture. The same reference numbers are used to depict similar features as presented in FIGS. 1-3. Any of the above-discussed apparatuses and their component parts can be manufactured by the method. E.g., the method can include forming a MEMS device 102 having a structural element 110, similar to that presented in FIGS. 1-5D.

Figure 6:
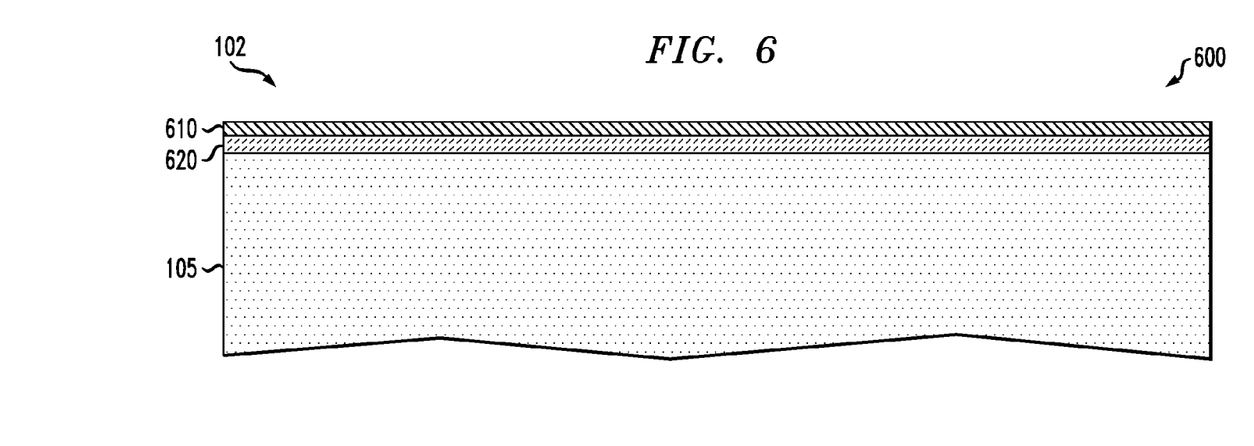
FIGS. 6-10 present cross-sectional views of an example embodiment of an apparatus of the disclosure at selected stages of manufacture.

FIG. 6 presents a cross-sectional view (analogous to that shown in FIG. 2) of the apparatus 600 after providing a substrate 105 having a material layer 610 thereon. The material layer 610 is rigidly fixed to the underlying substrate 105. In some embodiments, the material layer 610 is a silicon layer of a silicon-on-insulator (SOI) substrate 105. E.g., a silicon material layer 610 can be on a silicon oxide layer 620 of the SOI substrate 102. In other embodiments, the material layer 610 can be a silicon germanium, silicon oxide or silicon nitride layer formed on silicon, other semiconductor material, or other material substrate.

Figure 7:
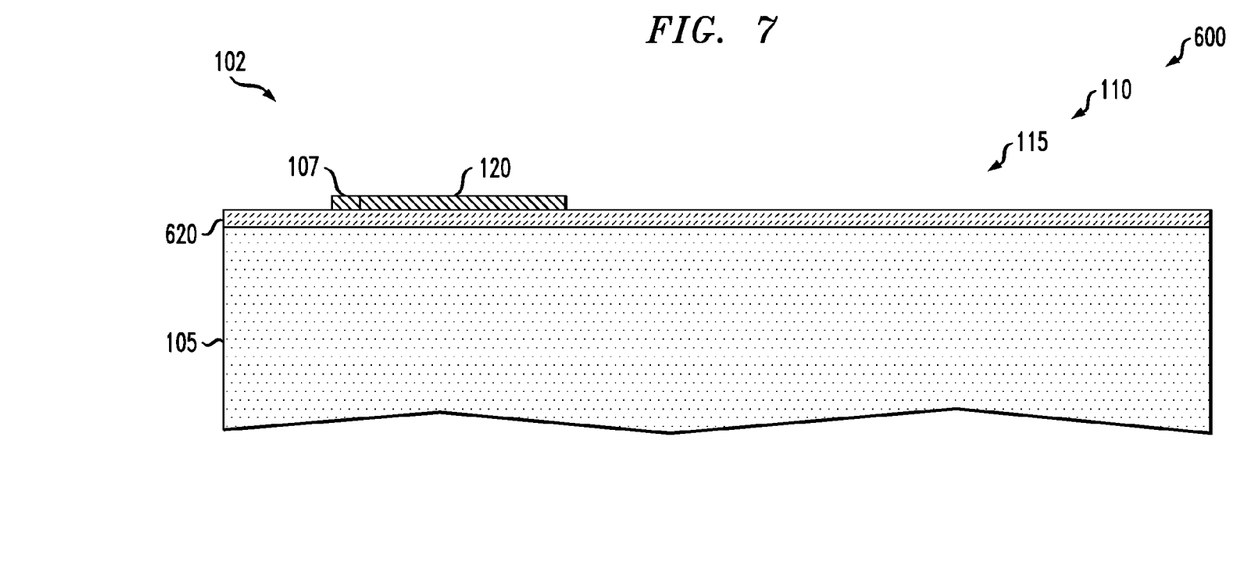

FIG. 7 shows the apparatus 600 of FIG. 6 after patterning the material layer 610 (FIG. 6) to form a first part 120 of a hot beam 115 of a structural element 110. One skilled in the art would understand how photolithographic procedures could be performed to deposit and develop a photoresist layer and then etch away portions of the material layer 610 to form the first part 120. To simplify the manufacturing process it is advantageous to concurrently pattern the material layer 610 to form other components of the MEMS device 102. E.g., patterning the material layer 610 can further include forming at least a portion of one or more anchoring pad 107, the anchoring pad 107 and first part 120 being continuously connected to each other. Patterning the material layer 610 can further include forming intra-beam bridge structures 152, 154, 156 that interconnect arms 160, 165 of the hot beam 115. Patterning the material layer 610 can also further include forming a first part 142 of a cold beam 140 of the structural element 110 (FIG. 3).

Figure 8:
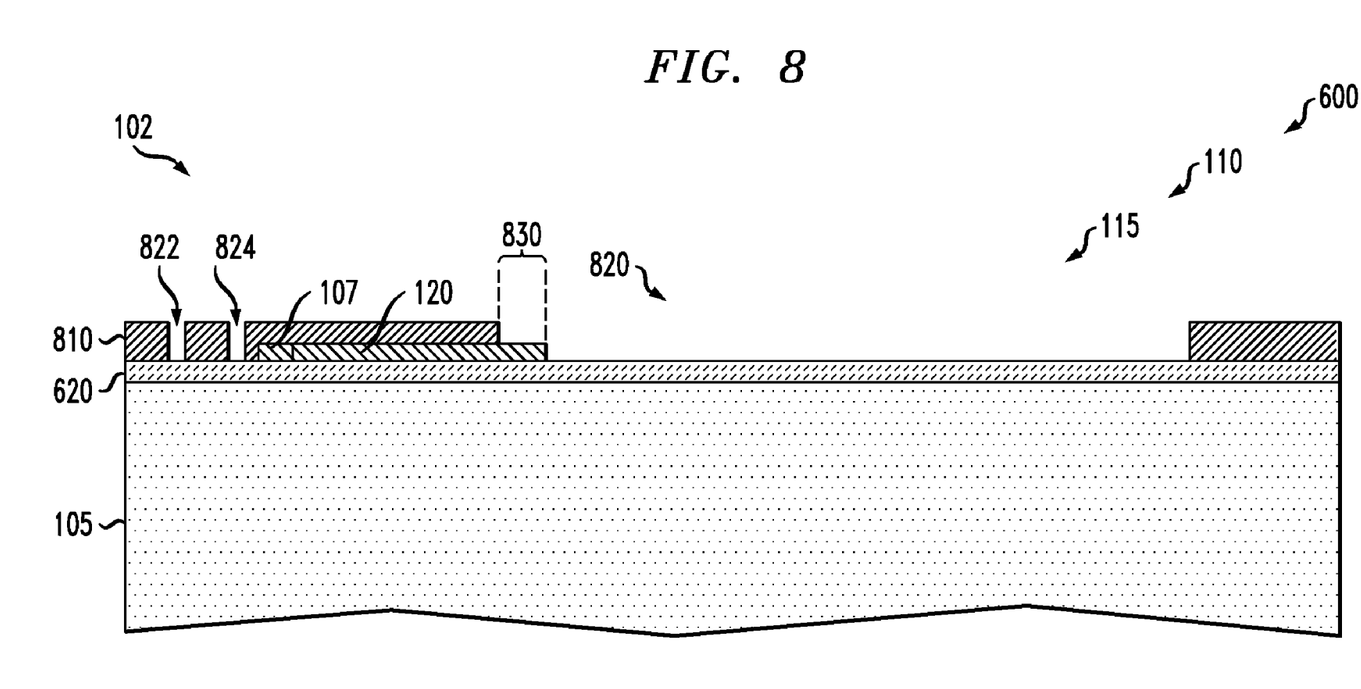

FIG. 8 shows the apparatus 600 of FIG. 7 after depositing a mask layer 810 on the substrate 105 and after forming openings 820, 822, 824 in the mask layer such that at least one of the openings 820 defines a location of a second part 125 (FIG. 9) of the hot beam 115. The mask layer 810 can comprise a photoresist material (e.g., SU8), hard mask material (e.g., silicon oxide or silicon nitride) or other conventional materials. The openings 820, 822, 824 can be formed using photolithographic techniques or using dry etch processes (e.g., reactive ion etching). In some cases to provide stronger coupling between the two parts 120, 125 at least one the openings 820 is formed such that there will be a region of overlap 830 between the first part 120 and second part 125.

To make the manufacturing process more efficient, forming some openings 822, 824 can also include forming an opening that defines locations for wires 170, 172 that will couple the second part 144 to a voltage source (not shown) of the MEMS device 102 (FIG. 1). Forming the openings 820 can further include forming openings in a different region of the mask layer 810 to define a location of the second part 144 of the cold beam 140 (FIG. 3).

Figure 9:
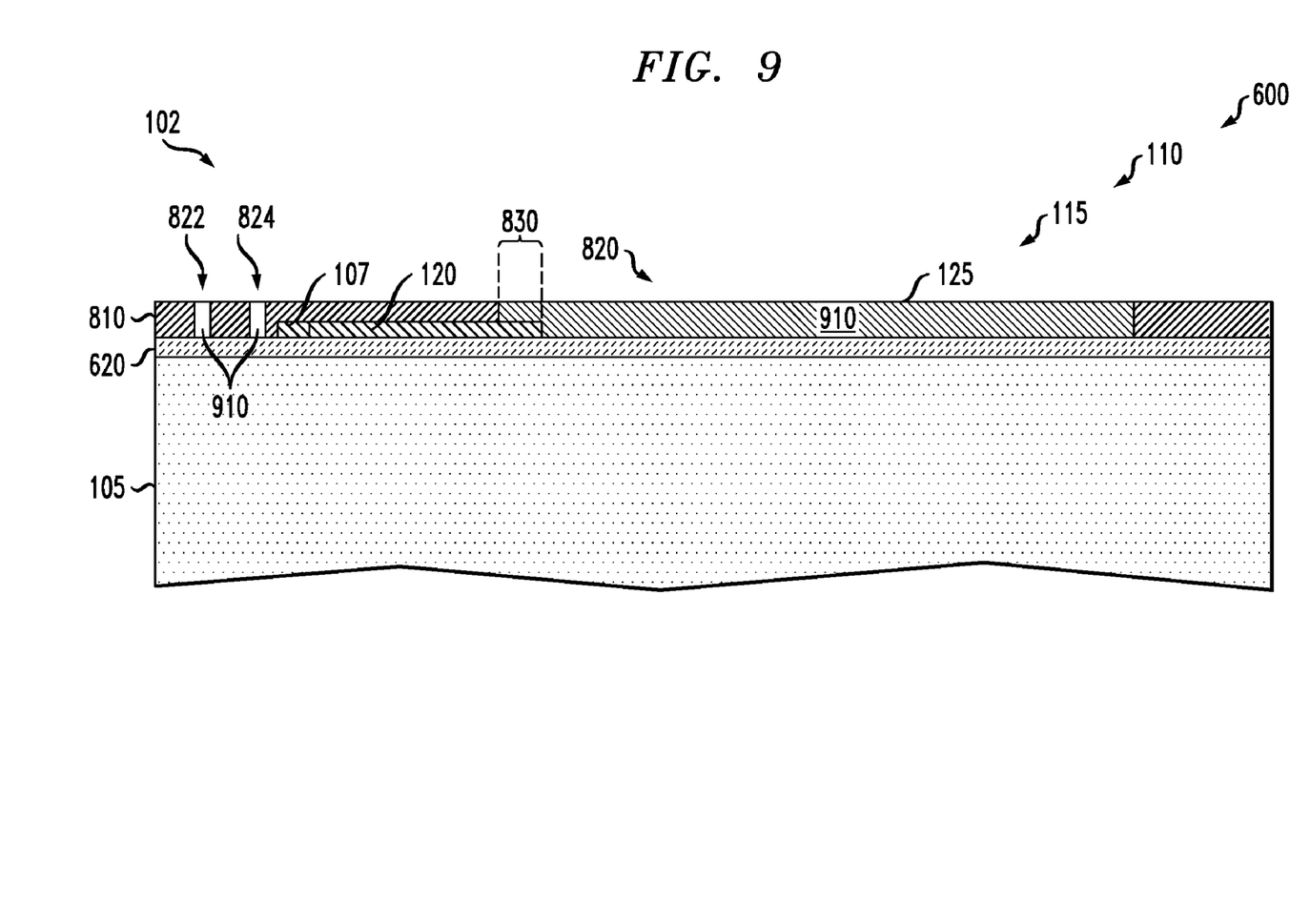

FIG. 9 shows the apparatus 600 of FIG. 8 after depositing an electrically conductive material 910 in the at least one opening 820 to thereby form the second part 125 of the hot beam 115 (FIGS. 1 and 2). In some cases the openings 822, 824 for the wires 170, 172 (FIG. 1) can also be filled with the electrically conductive material 910 (e.g., nickel). In other cases, a separate deposition step (e.g., of gold) is used to fills the openings 822 for the wires 170, 172.

Depositing the electrically conductive material 910 includes electrochemical or electroless deposition of a metal or metal alloy. Electrochemical deposition can include depositing a seed metal layer (e.g., Ni, Ti, Cu, Au, Pd, Sn) on the substrate 105, attaching an electrode to the seed layer and to a bath containing the electrically conductive material 910 (e.g., metal or metal alloy like Ni, Co or alloyed mixtures thereof) to be grown, placing the substrate into the bath, and passing a current between the bath and the seed layer. Electroless deposition can also include depositing a seed metal layer on the substrate 105 and placing the substrate 105 in an electroless deposition bath containing the electrically conductive material 910 (e.g., Ni or Co plus P or B). Additional examples of suitable electrochemical and electroless deposition process are presented in the above-incorporated 142' and 555' U.S. patent applications.

Figure 10:
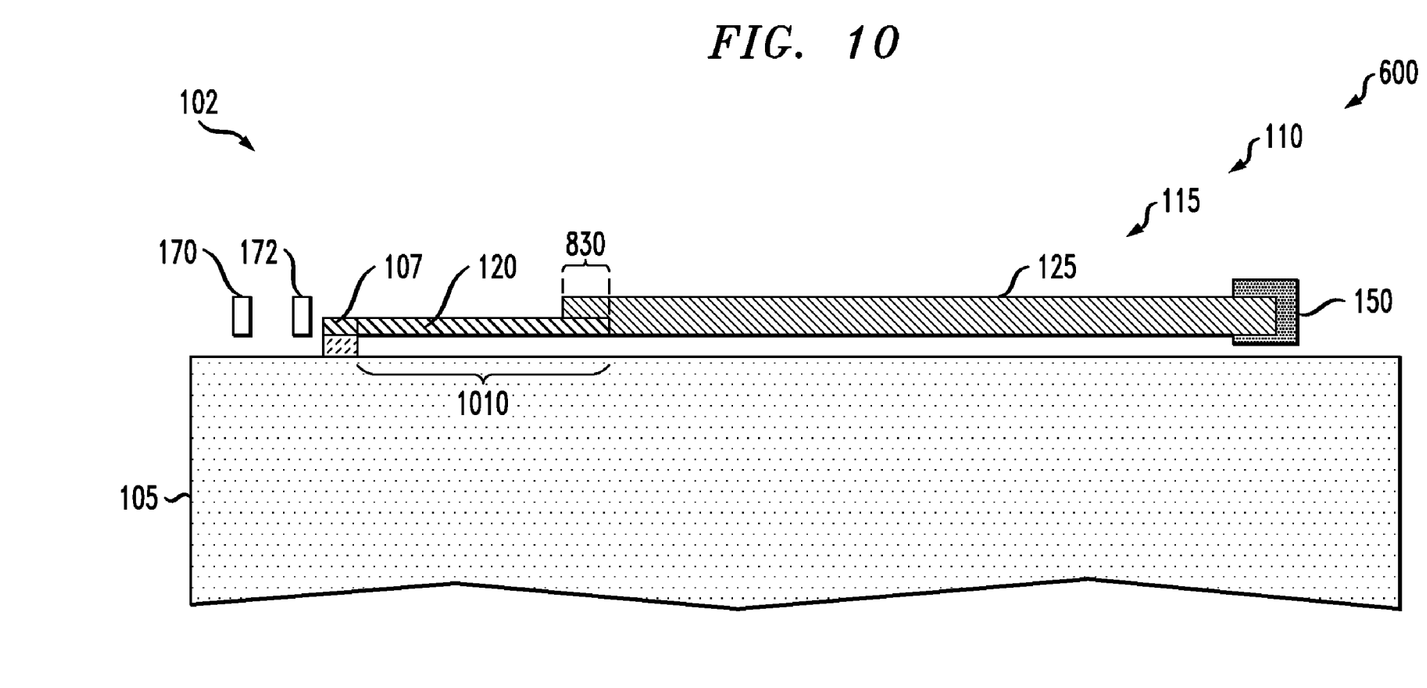

FIG. 10 shows the apparatus 600 of FIG. 9, after removing the mask layer 810 (FIG. 9) and after removing an underlying portion 620 (FIG. 9) of the substrate 105 to thereby release the second part 125 from the substrate 105. The step to remove the material layer 810 or underlying portion 620 can also release wires 170, 172 from the substrate 105. Those skilled in the art would be familiar with procedures to remove the mask layer 810 (FIG. 9) e.g., by ashing or organic solvent washing away a photoresist mask layer 810. Those skilled in the art would also be familiar with the procedures to removing an underlying portion of the substrate 105. E.g., in some cases, a timed etch (e.g., a hydrofluoric acid etch) is used to remove the underlying substrate (e.g., silicon oxide layer 620) to release the second part 120 from its direct attachment to the substrate 105 such that the second part can flex and move relative to the substrate 105.

Portions 1010 of the first part 120 can also be released from the substrate 105 as part of the timed etch, such that the first part 120 can flex and move similar to the second part 125. The timed etch, however, is configured to leave the first part 120, attached to both the substrate 105 (e.g., through the anchoring pad 107) and to the second part 125. Other structures of the MEMS device 102 such as the cold beam's 140 first and second parts 142, 144 or the bridge structures 150, 152, 154, 156 (FIG. 1) can also be released from the substrate 105 by this same time etch, or by separate time etches.

FIG. 10 also shows the apparatus 600 after forming an inter-beam bridge structure 150. In some cases, the bridge structure 150 can be formed by retaining a portion of the masking layer 810 (FIG. 8). In other cases, a separate photoresist or other insulating layer can be deposited on the substrate 105 and then patterned to form the inter-beam bridge structure 150.

There can be multiple additional steps to complete the manufacture of the apparatus. For instance referring again to FIG. 4, where the MEMS device 102 is configured as a microelectromechanical thermal relay, the method of forming the MEMS device 102 can further include forming the structural element 110 and a second structural element 410 as described above in the context of FIGS. 5-10. The method can also include electrically coupling a power source 440, a transmitter 450 and a receiver 455 to one or both the structural element 110, and second structural element 410. For instance, conventional techniques can be used to form electrically conductive contacts 109 and lines 445 (e.g., W, Au or Cu) on the substrate 105 to thereby interconnect the structural element 110 (and second structural element 410) with the power source 440, the transmitter 450 and the receiver 455.

Although the embodiments have been described in detail, those of ordinary skill in the art should understand that they could make various changes, substitutions and alterations herein without departing from the scope of the invention.

What is claimed is:

1. An apparatus, comprising:
    a microelectromechanical system (MEMS) device including:
        a substrate having an anchoring pad thereon; and
        a structural element having a beam that includes a first part that is attached to both said anchoring pad and to a second part that is movable with respect to said substrate, wherein said second part is made of an electrically conductive material, and said first part is selected from a group of materials consisting of:
    a material having a first yield stress that is greater than a second yield stress of said electrically conductive material of said second part;
    a material having a fatigue resistance that is greater than a second fatigue resistance of said electrically conductive material of said second part; and
    a material having a creep rate that is less than a second creep rate of said electrically conductive material of said second part.

2. The apparatus of claim 1, wherein said first part and said second part are consecutive sections of a long axis of said beam.

3. The apparatus of claim 1, wherein at least one dimension of said first part is shorter than an analogous dimension of said second part.

4. The apparatus of claim 1, wherein said beam is one of a hot beam or a cold beam.

5. The apparatus of claim 4, wherein said structural element further includes the other of said hot beam or said cold beam.

6. The apparatus of claim 5, wherein said hot beam and said cold beam each have said first part and said second part.

7. The apparatus of claim 5, wherein said first part of said hot beam has one or more dimension that is substantially equal to said same dimension of said first part of said cold beam.

8. The apparatus of claim 5, wherein said second part of said hot beam has a long axis that is substantially equal to said long axis of said second part of said cold beam.

9. The apparatus of claim 5, further including one or more bridge structures that are fixed to both said hot beam and said cold beam.

10. The apparatus of claim 1, wherein said beam includes at least two parallel arms and at least one bridge is rigidly fixed to both arms, wherein said at least one bridge is made of a same material as said first part.

11. The apparatus of claim 1, wherein said first part passes an electrical current to said second part.

12. The apparatus of claim 1, further including at least one wire that passes an electrical current to said second part.

13. The apparatus of claim 1, wherein said at least one wire has a strain-relief portion.

14. The apparatus of claim 1, wherein said beam is a cold beam, or said structural element further includes a cold beam, and said second part of said cold beam is configured to carry a signaling electrical current.

15. The apparatus of claim 1, wherein said second part of said beam is configured to carry an electrical current that is sufficient to heat said beam.

16. The apparatus of claim 1, further including:
    a voltage source electrically coupled to said structural element;
    a transmitter and a receiver electrically coupled to a second structural element, wherein said transmitter is configured to transmit a signal to said receiver through said structure element and said second structural element when one or both of said structure element and said second structural element are actuated to contact each other, and wherein
    said MEMS device is configured as a microelectromechanical thermal actuator and said second structure element is on said substrate and adjacent to, but electrically isolated from, said structural element when said structure element and said second structure element are not actuated.

17. The apparatus of claim 1, wherein said electrically conductive material includes nickel and said first part includes silicon.

18. The apparatus of claim 1, wherein said first part comprises a different material than said second part and said second part comprises an electrically conductive material.

19. A method of use, comprising:
    actuating a microelectromechanical thermal actuator device including:
        applying a voltage to a structural element of said device, said structural element having a beam that includes a first part that is rigidly attached to an anchoring pad on said substrate and to a second part that is movable with respect to a substrate, and said applied voltage is configured to actuate movement of said structural element,
    wherein said second part is made of an electrically conductive material and said first part is selected from a group of materials consisting of:
    a material having a first yield stress that is greater than a second yield stress of said electrically conductive material of said second part;

a material having a fatigue resistance that is greater than a second fatigue resistance of said electrically conductive material of said second part; and a material having a creep rate that is less than a second creep rate of said electrically conductive material of said second part.

20. A method of manufacturing an apparatus, comprising:

forming a microelectromechanical device having a structural element, including:

providing a substrate having a material layer thereon;

patterning said material layer to form a first part of a hot beam of said structural element;

depositing a mask layer on said substrate;

forming openings in said mask layer such that at least one of said openings defines a location of a second part of said hot beam;

depositing an electrically conductive material in said at least one opening to thereby form said second part of said hot beam; and removing an underlying portion of said substrate to thereby release said second part from said substrate, wherein a said first part remains attached to both said substrate and to said second part and, wherein said second part is made of an electrically conductive material and said first part is selected from a group of materials consisting of:

a material having a first yield stress that is greater than a second yield stress of said electrically conductive material of said second part;

a material having a fatigue resistance that is greater than a second fatigue resistance of said electrically conductive material of said second part; and a material having a creep rate that is less than a second creep rate of said electrically conductive material of said second part.

21. The method of claim 20, wherein patterning said material layer further includes forming a first part of a cold beam of said structural element, and forming said openings further includes forming an opening in said mask layer such that at least one of said openings defines a location of said second part of said cold beam.

22. The method of claim 20, wherein depositing said electrically conductive material includes electrochemical or electroless deposition of a metal or metal alloy.

23. The method of claim 20, further including manufacturing said microelectromechanical device as a microelectromechanical thermal actuator, including:

electrically coupling a voltage source to said structural element;

forming a second structural element on said substrate, wherein said second structural element is adjacent to said structural element but electrically isolated from said structural element when said structure element is not actuated; and electrically coupling a transmitter and a receiver to one or both of said structural element or said second structural element.

* * * * *